Nov. 11, 1958 J. M. CLARK 2,860,239

RECEIVER CIRCUIT

Filed July 24, 1953

INVENTOR.
James M. Clark
BY Norman L. Mueller
Atty.

United States Patent Office 2,860,239

Patented Nov. 11, 1958

2,860,239

RECEIVER CIRCUIT

James M. Clark, Hinsdale, Ill., assignor to Motorola, Inc., Chicago, Ill., a corporation of Illinois Application July 24, 1953, Serial No. 370,061

6 Claims. (Cl. 250—20)

This invention relates generally to volume control systems and more particularly to a volume control system for a frequency modulation receiver which operates through a variable direct current potential and facilitates remote control of volume.

It has been common practice to provide volume control in a radio receiver by applying the output of the detector to a potentiometer and deriving a portion of the output from an adjustable tap on the potentiometer to thereby control the level of the detected signal applied to the audio amplifier stages of the receiver. Such a system has the disadvantages that adjustment of the volume affects the frequency response of the system and the inverse feedback circuits which may be used in the system are limited. Further, when remote control of the volume is required, as in mobile installations, the remote leads carrying audio tend to pick up disturbances which are thereby introduced into the audio output of the receiver.

It is therefore an object of the present invention to provide an improved audio control system for radio receivers.

Another object of the invention is to provide a volume control system for a frequency modulation receiver which provides a wide range of volume control by a very simple circuit.

A further object of the invention is to provide a volume control circuit for a frequency modulation radio receiver wherein the audio level is controlled by the adjustment of a direct current potential, and a control operating on the audio signal itself is not required.

A feature of this invention is the provision of a volume control circuit for a frequency modulation receiver wherein the volume is controlled by controlling the direct current potential applied to the last limiter stage of the receiver which feeds the discriminator thereof to thereby control the slope of the discriminator. The circuit may be provided by a neutralized triode limiter stage or a pentode stage wherein both the plate and screen potentials are varied.

A further feature of this invention is the provision of a volume control system for a frequency modulation receiver wherein volume control is provided by varying the direct current operating bias potential applied to one or more stages thereof and remote control can be provided without bringing the audio cable out of the receiver. This eliminates the introduction of noise into the audio in mobile applications.

Another feature of this invention is the provision of a volume control system for a frequency modulation receiver wherein a single control adjusts the operating potential applied to the limiter and to the first audio amplifier so that control of the audio by changing the discriminator slope in conjunction with change of bias of the audio amplifier provides a wide range of control of the audio level.

Further objects, features and the attending advantages of the invention will be apparent from a consideration of the following description when taken in connection with the accompanying drawing, in which.

In practicing the invention there is provided a frequency modulation radio receiver of the superheterodyne type. The intermediate frequency waves are limited and applied to a discriminator wherein the frequency modulation is converted to amplitude modulation for the audio amplifier stages of the receiver. The discriminator has a tuned discriminator coil connected to the output of the last limiter stage in a direct current circuit. The audio level is controlled by an adjustable direct current potential which is applied to the limiter stage. This controls the limiting level and the slope of the discriminator frequency-amplitude curve, to thereby control the audio amplitude at the output of the discriminator which is applied to the audio amplifier stages. The adjustable direct current potential may also be applied to the first audio amplifier stage to control the bias thereof and thereby control the gain. The resulting control of the audio level does not cause changes in the audio frequency response of the receiver. Further remote control can be practiced without bringing out the audio itself to eliminate pickup of noise by the audio leads. The system may be practiced with a triode limiter with a wide control range being provided by the use of plate to grid neutralization. The system is also applicable for use with a limiter having a pentode tube in which case the potential applied to the screen as well as the potential applied through the discriminator coil to the plate may be varied to thereby provide a wide range of audio levels.

Figures 1, 2:
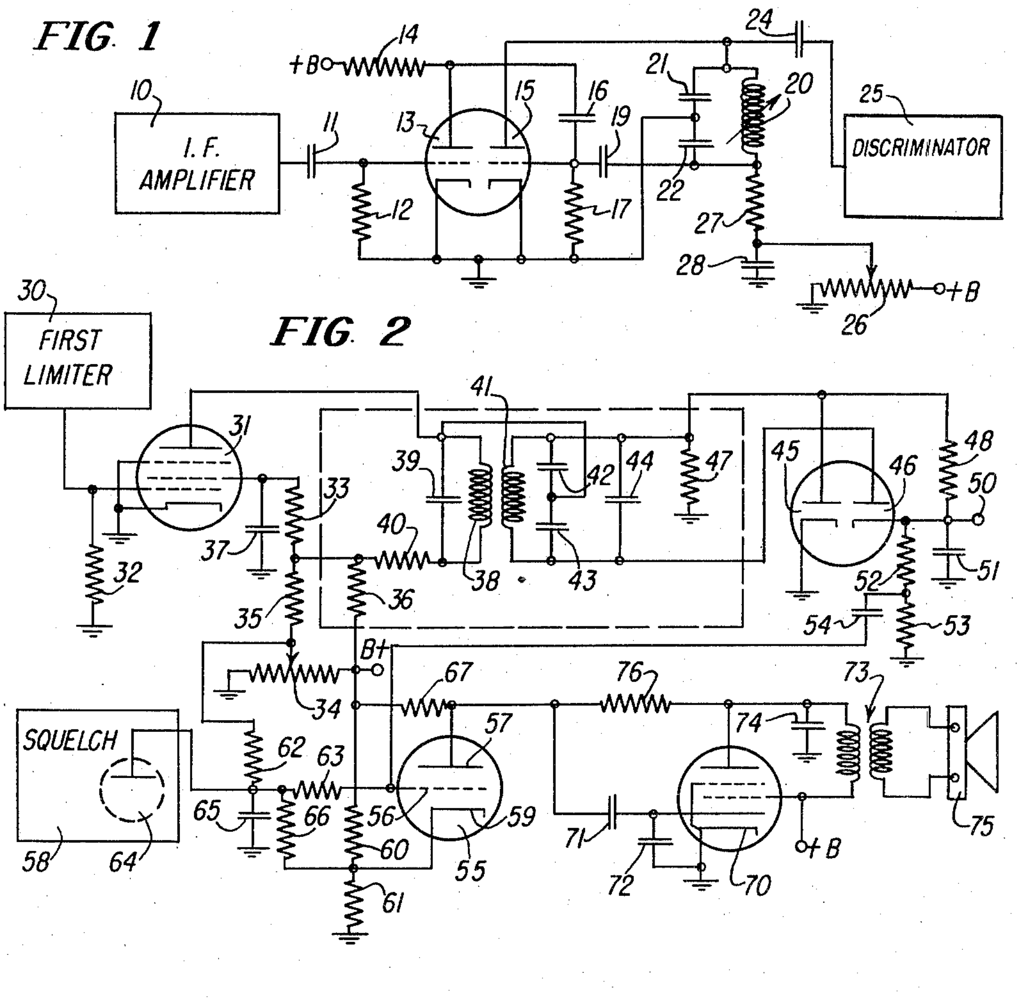
Fig. 1 is a circuit diagram of one embodiment of the volume control system in accordance with the invention.
Fig. 2 is a circuit illustrating a second embodiment of the volume control system.

Referring now to the drawings, in Fig. 1 there is illustrated a circuit in which triode limiter tubes are used. The output from the intermediate frequency amplifier 10 of the receiver is applied through condenser 11 across grid leak resistor 12 to a first limiter stage formed by the first triode section 13. The cathode of this section is grounded and the plate connected through resistor 14 to a B+ potential source. The output of the first limiter stage is applied to a second limiter stage including triode 15 which may be included in a single envelope with the triode 13 of the first limiter stage. The signal is coupled to the limiter tube 15 through the condenser 16, being applied across resistor 17. The output of the limiter tube 15 is applied to the discriminator coil 20 connected to the plate thereof. The range of the audio level control may be increased by the use of neutralizing condenser 19 which tunes out the plate to grid capacity of the tube 15 so that the linear range thereof is increased.

The discriminator coil 20 is tuned by condensers 21 and 22 having the center connection therebetween grounded. The voltage developed across the discriminator coil 20 is applied through condenser 24 to the discriminator circuit 25 which includes a secondary coil and rectifiers. This circuit may, for example, be in accordance with Patent No. 2,404,359 issued July 23, 1946 to Marion E. Bond.

Operating voltage for the triode 15 of the second limiter stage is applied from B+ through the variable potentiometer 26. The movable tap on this potentiometer is connected to resistor 27 through which the potential is applied to coil 20 and to the plate of the triode 15. Condenser 28 provides radio frequency bypass. The direct current potential applied from resistor 26 controls the limiting level in the triode 15 to thereby control the amplitude of the carrier wave applied to the discriminator. The change in carrier level changes the slope of the frequency-amplitude characteristic of the discriminator. This permits a wide range of control of the audio signal in a receiver independently of the audio amplifier so that the audio amplifier may have constant gain. The audio amplifier may therefore be constructed to provide high gain, good audio frequency response, and a minimum of distortion by careful design and use of inverse feedback.

The circuit in accordance with the invention also facilitates the use of remote control of the amplitude level, since the control is accomplished entirely by the variation of a direct current potential. The current required is small so that the cable for providing the variable potential may be of small inexpensive construction. The use of such a control makes it unnecessary to apply the audio signal over a remote control cable which is effective to pick up various noises such as hum and vibrator hash in mobile installations.

In Fig. 2 there is shown a second circuit utilizing the invention. This circuit is a portion of a frequency modulation receiver which may include a first limiter stage or stages 30 and a final limiter stage including the tube 31. The tube 31 is a pentode tube having the cathode and suppressor grids grounded, with the signal being applied to the control grid across the grid resistor 32. The screen grid is connected to B+ through resistor 33, and a control network including potentiometer 34 and resistors 35 and 36. The screen grid is bypassed by a condenser 37. The plate of the pentode is connected to discriminator coil 38 which is tuned by condenser 39. The coil is connected to B+ through resistor 40 and through the network including potentiometer 34 and resistors 35 and 36.

The discriminator primary coil 38 is inductively coupled to coil 41 which is bridged by condensers 42 and 43 having the center tap thereof connected to the upper terminal of the coil 38 to provide a quadrature component. The coil 41 is also bridged by temperature compensating condenser 44 and the ends of the coil are connected respectively to the discriminator diodes 45 and 46. Resistor 47 forms the load for diode 45 and resistor 48 forms the load for diode 46. Although the resistor 48 is not directly connected to the plate of diode 46, it is connected thereto through the coil 41 which has low resistance. The output of the discriminator is derived from the cathode of diode 46 at terminal 50. Condenser 51 serves to bypass the radio frequencies.

The discriminator output at terminal 50 may be of quite high level for use in an automatic frequency control circuit of the receiver. This output is divided by resistors 52 and 53 and applied through condenser 54 to the first audio amplifier stage including the tube 55. The audio signal is applied to the grid 56 of the first audio amplifier stage which is biased by a voltage derived from the potentiometer 34. This grid may also be biased by a squelch system 58. It is to be noted that the cathode 59 of the triode is held at a positive potential by the voltage divider formed of resistors 60 and 61 connected between B+ and ground. For the tube 55 to conduct, the grid 56 thereof must be at a higher potential than 55 obtains operating potential from B+ through resistor 63.

The squelch system 58 may include a tube 64 which when conducting holds the grid 56 at a low potential so that the amplifier tube 55 is blocked. However, when the squelch tube 64 is not conducting, as when a signal is received, the bias on the grid will be controlled by the position of the potentiometer 34 to thereby control the amplification of the first audio stage. The bias applied to the grid 56 is bypassed by condenser 65, and resistor 66 forms a grid return to the cathode. The plate 57 of the triode 65 obtains operating potential from B+ through resistor 67.

The output of the first audio amplifier stage is applied to an output stage which includes the pentode tube 70. The output from the plate 57 is applied through condenser 71 to the control grid of the tube 70. The cathode of the tube 70 is connected to ground and the grid and cathode are connected by de-emphasis condenser 72. Operating potential is applied to the screen grid and plate from B+ with the transformer 73 being connected in the plate circuit. Condenser 74 is part of the de-emphasis system. Transformer 73 may be connected to a reproducing device 75 which may be a loud speaker or headphones. Degenerative feedback is provided by the resistor 76 connected from the plate of the pentode 70 back to the plate of the triode 57.

As in Fig. 1, control of the audio level is provided in the circuit of Fig. 2 by variation of the direct current voltage applied to the last limiter stage. This is accomplished in Fig. 2 by adjustment of the movable contact on potentiometer 34. When this contact is at the B+ end, the resistors 35 and 36 in parallel apply the B+ potential through resistor 33 to the screen grid, and through resistor 40 and coil 38 to the plate of the tube 31. The potential is decreased as the movable tap is moved toward ground and when this tap is at the ground end, the B+ voltage is divided by resistors 36 and 35, and the intermediate potential therebetween is applied through the resistor 33 to the screen grid, and through resistor 40 and coil 38 to the plate. This limits the minimum voltage which may be applied to a value which will provide the output required for the automatic frequency control system. In actual practice the resistors 35 and 36 may have the same value so that the potential is divided equally therebetween and half the B+ voltage is effectively applied to the system.

As previously stated, the potential from the movable contact on potentiometer 34 also controls the bias on the grid of the amplifier tube 55 to thereby control the gain of this tube. Accordingly, the gain control provided by variation of the slope of the discriminator is supplemented by control of the gain of the first amplifier tube 55. It is to be noted, however, that the gain of the tube 55 is controlled by a bias change from a direct current potential, and an audio frequency potentiometer is not required to divide down the audio signal. As the audio signal is held within relatively narrow limits by the control resulting from the slope change, the control provided by the bias adjustment is such that very little or no distortion takes place therefrom. That is, the signal applied to the amplifier tube is never so great that the bias control required for cutting it down would cause clipping of the audio frequency and thereby distort the same. The addition of the bias control is particularly necessary in receivers wherein automatic frequency control is used as it is necessary in such systems to provide a discriminator output of high level for the automatic frequency control action. It is therefore not possible to cut down the audio greatly by the discriminator slope variation. However, the audio level is within the range wherein control by bias change in the audio amplifier stage will bring the audio output to the desired levels.

Figure 3:
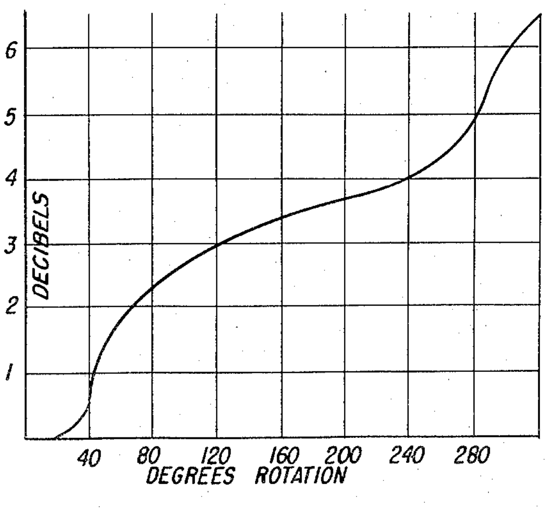
Fig. 3 is a curve illustrating the change in discriminator output with rotation of the volume control in the system of Fig. 2.

In Fig. 3 there is illustrated the control of the discriminator output by the circuit shown in Fig. 2. The abscissa of the curve of Fig. 3 shows the degrees of rotation of the potentiometer 34 and the ordinate shows the decibel change in the discriminator output. It is noted that a 6 decibel change is provided at the output of the discriminator. Although this is a relatively small change, it is sufficient to hold the audio signal within limits so that bias control will provide the additional variation necessary without causing distortion. It is noted that the slope change is very slight at the center of the range and is maximum near the ends of the range. Therefore, the discriminator change will be effective to cut down extremely strong audio frequency signals and to give a large boost to extremely weak audio frequency signals and provide relatively small changes in signals within the middle of the range. Greater range adjustment, of course, is provided by the bias control which supplements the slope control shown in Fig. 3. This arrangement, illustrated in Fig. 2, is also applicable to the system of Fig. 1 to provide control of the audio level by changing the bias of the audio amplifier tube to supplement the volume control resulting from the limiter-discriminator action.

As the same control adjusts both the slope and the bias, the circuit is extremely simple. It has the important advantage that it is accomplished entirely by direct current. As previously stated, this is particularly important in applications wherein remote control is required such as in mobile receivers wherein the receiver is positioned in one place in a vehicle and the control is placed to be convenient for the operator of the vehicle. Since ignition and other noises are present in such a vehicle, these are picked up by the remote control leads, and when the remote control includes an audio circuit these noises are introduced into the audio circuit. However, by the use of the direct current remote control circuit, the problem of introduction of noise into the audio system is eliminated.

Although certain embodiments of the invention which are illustrative thereof have been described, it is obvious that various changes and modifications can be made within the intended scope of the invention as defined in the appended claims.

I claim:

1. In a frequency modulation radio receiver of the superheterodyne type including frequency converting means, intermediate frequency amplifier means, limiter means, frequency discriminator means, and audio amplifier means connected in series in the order named, the combination including a limiter stage forming a part of said limiter means and including a triode tube having plate and grid electrodes, a discriminator coil forming a part of said discriminator means and having one end thereof connected to said plate electrode, condenser means connecting said grid to the other end of said discriminator coil for tuning out the capacitance between said plate and grid so that said triode tube has a wide linear operating range, and adjustable means for applying a direct current potential to said other end of said discriminator coil, said adjustable means controlling the potential applied through said coil and to said plate electrode to thereby control the output level of said limiter stage and the slope of the frequency-amplitude characteristic of said discriminator coil, whereby the level of the audio signal at the discriminator means is controlled by said adjustable means.

2. In a frequency modulation radio receiver the combination including, a limiter stage for limiting the amplitude of a frequency modulated wave applied thereto, a discriminator stage connected to said limiter stage for converting the frequency variations of said wave into an audio signal, an audio amplifier stage connected to said discriminator stage for amplifying the audio signal, said limiter stage including an output electrode, said discriminator stage including a discriminator coil connected in a direct current circuit to said output electrode, said audio amplifier stage including an electrode which controls the gain thereof in response to the direct current bias applied thereto, and means for applying a direct current potential to said output electrode of said limiter stage through the direct current circuit and to said gain controlling electrode of said amplifier stage, said means being adjustable to control the potential applied therefrom to control the output level of said limiter stage and the slope of said discriminator stage and thereby control the level of the audio signal produced by said discriminator stage, said adjustable means also controlling the bias applied to said gain controlling electrode of said audio amplifier stage to further control the level of the audio signal.

3. In a frequency modulation radio receiver of the superheterodyne type including frequency converting means, intermediate frequency amplifier means, limiter means, frequency discriminator means, and audio amplifier means connected in series in the order named, the combination including a limiter stage forming a part of said limiter means and including a tube having at least one output electrode, a discriminator coil forming a part of said discriminator means and connected in a direct current circuit to said output electrode, an audio amplifier tube forming a part of said audio amplifier means and having a grid adapted to receive a bias for controlling the gain thereof, and adjustable means for applying a direct current potential to said output electrode of said limiter tube and to said grid of said audio amplifier tube, said adjustable means controlling the potential applied to said output electrode to thereby control the slope of the frequency-amplitude characteristic of said discriminator coil and also controlling the gain of said audio amplifier tube, whereby the level of the audio signal of the receiver is controlled over a wide range by variation of the direct current potential.

4. In a frequency modulation radio receiver of the superheterodyne type including frequency converting means, intermediate frequency amplifier means, limiter means, frequency discriminator means, and audio amplifier means connected in series in the order named, the combination including a limiter stage forming a part of said limiter means and including a tube having screen grid and plate electrodes, a discriminator coil forming a part of said discriminator means and having two terminals with one terminal thereof connected to said plate electrode, an audio amplifier tube forming a part of said audio amplifier means and having a grid adapted to receive a bias for controlling the gain thereof, and adjustable means for applying a direct current potential to said screen grid electrode of said limiter tube, to the other terminal of said discriminator coil for application to the plate electrode of said limiter tube, and to said grid of said audio amplifier tube, said adjustable means controlling the potentials applied to said limiter tube to thereby control the slope of the frequency-amplitude characteristic of said discriminator stage in accordance with a predetermined characteristic and controlling the gain of said audio amplifier tube, whereby the level of the audio signal of the receiver is controlled over a wide range by variation of the direct current potential.

5. The combination of claim 3 wherein said tube of said limiter stage is of the triode type having a grid and with capacitance between said grid and the output electrode of said triode tube, and including condenser means connecting said grid of said triode tube to said discriminator coil at a point thereon remote from the connection of said coil to said output electrode of said triode tube, said condenser means having a value which tunes out said capacitance between said grid and said output electrode of said triode limiter tube so that said tube has a wide linear operating range.

6. In a frequency modulation radio receiver the combination including, a limiter stage for limiting the amplitude of a frequency modulated wave applied thereto, a discriminator stage connected to said limiter stage for converting the frequency variations of said wave into an audio signal, an audio amplifier connected to said discriminator stage for amplifying the audio signal, said limiter stage including an electron device having an output electrode, said discriminator stage including a discriminator coil connected in a direct current circuit to said output electrode, said audio amplifier including an electron device having an electrode which controls the gain of said device in response to the direct current bias applied thereto, and potential supply means coupled to said direct current circuit and to said gain controlling electrode of said amplifier stage, said potential supply means including an adjustable portion for controlling the potential applied therefrom through said direct current circuit to said output electrode of said electron device of said limiter stage to control the output level of said limiter stage and the slope of said discriminator stage and thereby control the level of the audio signal produced by said discriminator stage, said adjustable portion controlling the potential applied to said gain controlling electrode of said electron device of said audio amplifier to thereby control the bias of said electron device and further control the level of the audio signal.

References Cited in the file of this patent

UNITED STATES PATENTS

| | | |
|---|---|---|
| 1,893,671 | Hentschel | Jan. 10, 1933 |
| 2,047,003 | Chittick | July 7, 1936 |
| 2,216,582 | Barton | Oct. 1, 1940 |
| 2,266,541 | Foster et al. | Dec. 16, 1941 |
| 2,281,693 | Holst et al. | May 5, 1942 |

FOREIGN PATENTS

| | | |
|---|---|---|
| 375,357 | Great Britain | June 24, 1932 |